(12) United States Patent
Zhang et al.

(10) Patent No.: US 11,956,987 B2
(45) Date of Patent: Apr. 9, 2024

(54) DISPLAY PANEL AND PREPARATION METHOD THEREOF, AND DISPLAY DEVICE

(71) Applicants: Chongqing BOE Display Technology Co., Ltd., Chongqing (CN); BOE Technology Group Co., Ltd., Beijing (CN)

(72) Inventors: Qiang Zhang, Beijing (CN); Xiaoge Wang, Beijing (CN); Jiabin Cui, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 74 days.

(21) Appl. No.: 17/215,003

(22) Filed: Mar. 29, 2021

(65) Prior Publication Data
US 2022/0020946 A1    Jan. 20, 2022

(30) Foreign Application Priority Data
Jul. 15, 2020    (CN) .......................... 202010679203.3

(51) Int. Cl.
  *H10K 50/84*    (2023.01)
  *H10K 50/844*   (2023.01)
  *H10K 71/00*    (2023.01)

(52) U.S. Cl.
  CPC ......... *H10K 50/841* (2023.02); *H10K 50/844* (2023.02); *H10K 71/00* (2023.02)

(58) Field of Classification Search
  CPC ... H01L 27/32; H01L 2227/323; G09F 9/301; H10K 59/12
  See application file for complete search history.

(56) References Cited

U.S. PATENT DOCUMENTS

| 10,868,102 B1 | 12/2020 | Zhang et al. |
| 2017/0372661 A1* | 12/2017 | Gu ...................... H01L 27/3276 |

(Continued)

FOREIGN PATENT DOCUMENTS

| CN | 106653820 A | 5/2017 |
| CN | 110120403 A | 8/2019 |

(Continued)

OTHER PUBLICATIONS

Office Action for corresponding CN 202010679203.3 dated Jan. 9, 2022.

*Primary Examiner* — Yu-Hsi D Sun
(74) *Attorney, Agent, or Firm* — ArentFox Schiff LLP; Michael Fainberg

(57) ABSTRACT

The present application discloses a display panel and a preparation method thereof, and a display device. The display panel includes a base substrate, and has a display area, a peripheral area surrounding the display area, a hole area located at the display area, and an isolation area located between the hole area and the display area. The display area includes an electroluminescent device located on the base substrate, and a packaging structure for sealing the electroluminescent device, the packaging structure includes an inorganic packaging layer and an organic packaging layer alternately stacked, and the inorganic packaging layer extends to the hole area. The isolation area includes an organic layer located on the inorganic packaging layer.

20 Claims, 3 Drawing Sheets

(56) References Cited

U.S. PATENT DOCUMENTS

| | | | |
|---|---|---|---|
| 2018/0226610 A1* | 8/2018 | Moon | H01L 51/5253 |
| 2019/0074460 A1* | 3/2019 | Cai | H10K 71/135 |
| 2019/0245160 A1* | 8/2019 | Yoon | H01L 27/3258 |
| 2020/0328257 A1* | 10/2020 | Kim | H01L 51/5096 |
| 2021/0005843 A1* | 1/2021 | Kishimoto | H01L 51/5256 |
| 2021/0135151 A1* | 5/2021 | Baek | H01L 51/5237 |
| 2021/0210722 A1* | 7/2021 | Li | H10K 59/124 |

FOREIGN PATENT DOCUMENTS

| | | | |
|---|---|---|---|
| CN | 110416435 A | 11/2019 | |
| CN | 110610970 A | 12/2019 | |
| CN | 111312723 A | 6/2020 | |

* cited by examiner

US 11,956,987 B2

DISPLAY PANEL AND PREPARATION METHOD THEREOF, AND DISPLAY DEVICE

CROSS-REFERENCE TO RELATED TECHNICAL FIELD

The present application is based on and claims priority under 35 U.S.C. 119 to Chinese Patent Application No. 202010679203.3, filed on Jul. 15, 2020, in the China National Intellectual Property Administration (CNIPA), the entire contents of all of which are incorporated herein by reference.

FIELD

The present application relates to the field of display technology, and in particular to a display panel and a preparation method thereof, and a display device.

BACKGROUND

With the rapid development of the intelligent terminal industry, the folding and hole-punched organic light-emitting diode (OLED) display screen has become the mainstream product in the market.

In the related art, packaging of the OLED device mainly depends on the thin film packaging technology, which uses inorganic layers and organic layers to alternately form the packaging thin film. Due to the inherent brittleness of the inorganic layers in thin film packaging, for the area only covered with the inorganic layers in the hole area, the stress of the inorganic layers cannot be released during bending, and crack of the inorganic layers is prone to occurring, thus leading to uneven brightness (mura) in the hole area and peeling of the inorganic layers in the hole area, causing packaging failure and affecting the product yield.

SUMMARY

An embodiment of the present application provides a display panel and a preparation method thereof, and a display device. The display panel includes a base substrate, and the display panel has a display area, a peripheral area surrounding the display area, a hole area located at the display area, and an isolation area located between the hole area and the display area;

the display area includes an electroluminescent device located on the base substrate, and a packaging structure for sealing the electroluminescent device;

the packaging structure includes an inorganic packaging layer and an organic packaging layer alternately stacked;

the inorganic packaging layer extends to the hole area; and the isolation area includes an organic layer disposed on the inorganic packaging layer.

In some embodiments, the hole area further includes the organic layer disposed on the inorganic packaging layer.

In some embodiments, the isolation area further includes a first blocking wall for blocking extension of the organic packaging layer, a second blocking wall located between the first blocking wall and the hole area, and an isolation column located between the second blocking wall and the hole area; and the organic layer extends from the hole area to cover the isolation column, the second blocking wall and at least part of the first blocking wall.

In some embodiments, the organic layer covers an edge of the organic packaging layer.

In some embodiments, a distance from a surface, facing away from the base substrate, of the organic layer to the base substrate is approximately equal to a distance from a surface, facing away from the base substrate, of the packaging structure in the display area to the base substrate.

In some embodiments, a material of the organic layer is equal to a material of the organic packaging layer.

In some embodiments, the material of the organic layer and the material of organic packaging layer include acrylic resin.

In some embodiments, the inorganic packaging layer extends to the peripheral area, and the peripheral area further includes the organic layer disposed on the packaging structure.

In some embodiments, a thickness of the organic layer of the peripheral area ranges from 5 microns to 10 microns.

An embodiment of the present application provides a preparation method of a display panel. The method includes:

forming an electroluminescent device on a display area of a base substrate;

forming an inorganic packaging layer and an organic packaging layer sequentially on the electroluminescent device to form a packaging structure, where the inorganic packaging layer and the organic packaging layer are alternately stacked, and the inorganic packaging layer extends from the display area to a hole area located at the display area; and forming an organic layer on the packaging structure in an isolation area between the display area and the hole area.

In some embodiments, while forming the organic layer on the packaging structure in the isolation area, the method further includes:

forming the organic layer on the packaging structure in the hole area.

In some embodiments, the inorganic packaging layer extends to a peripheral area surrounding the display area, and while forming the organic layer on the packaging structure in the hole area, the method further includes:

forming the organic layer on the packaging structure in the peripheral area.

An embodiment of the present application provides a display device. The display device includes the above display panel provided by the embodiment of the present application.

BRIEF DESCRIPTION OF THE DRAWINGS

For clearer description of the technical solutions in the embodiments of the present application, the accompanying drawings for describing the embodiments are introduced briefly hereinafter. Apparently, the accompanying drawings in the following description are only about some embodiments of the present application, and persons of ordinary skill in the art may derive other drawings from these accompanying drawings without created efforts.

DETAILED DESCRIPTION OF THE EMBODIMENTS

Figure 1:
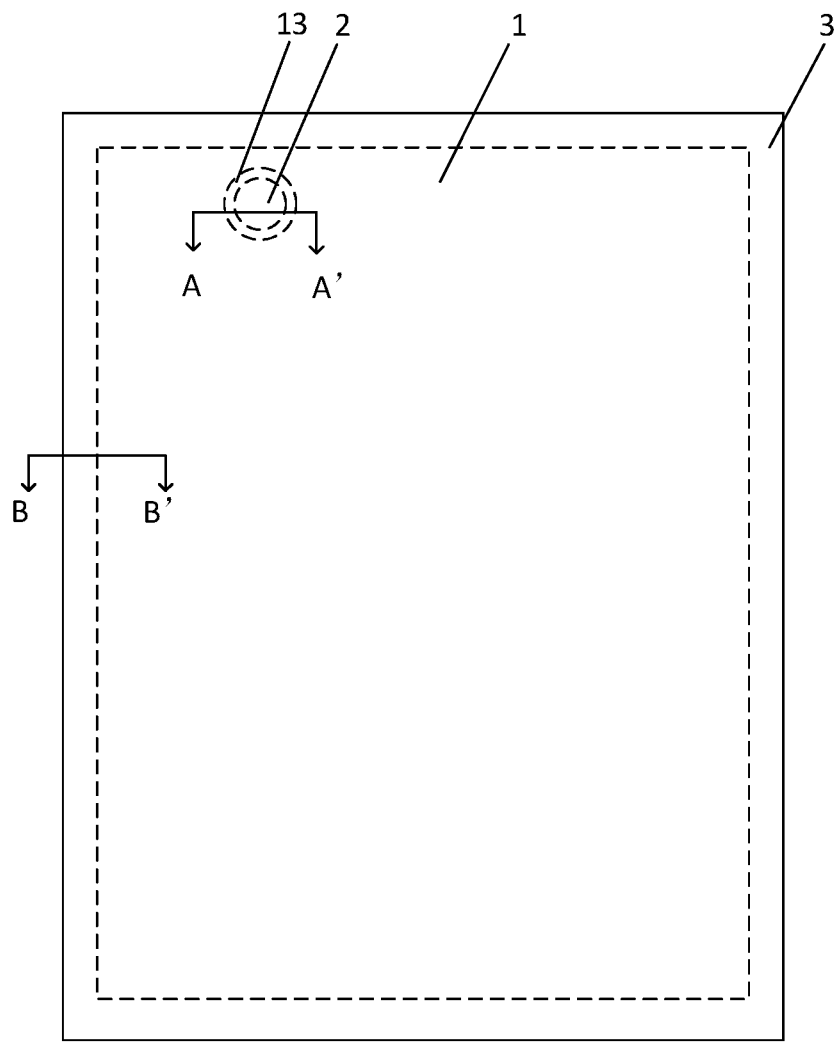
FIG. 1 is a schematic diagram of a display panel provided by an embodiment of the present application.

An embodiment of the present application provides a display panel. As shown in FIG. 1, the display panel includes a base substrate 4, and has a display area 1, a peripheral area 3 surrounding the display area 1, a hole area 2 located at the display area 1, and an isolation area 13 located between the hole area and the display area.

Figure 2:
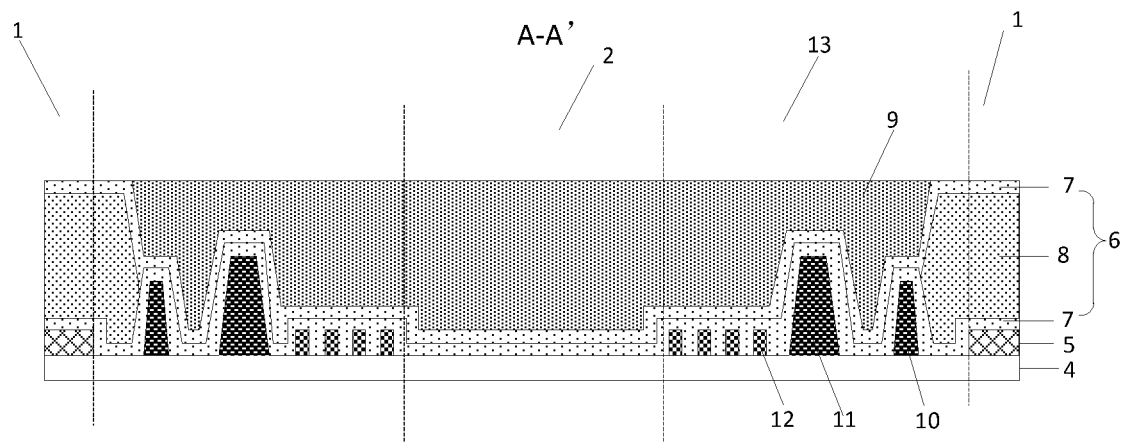
FIG. 2 is another schematic diagram of a display panel provided by an embodiment of the present application.

As shown in FIG. 2, the display area 1 includes an electroluminescent device 5 located on the base substrate 4, and a packaging structure 6 for sealing the electroluminescent device 5.

The packaging structure 6 includes an inorganic packaging layer 7 and an organic packaging layer 8 which are alternately stacked; and the inorganic packaging layer 7 extends to the hole area 2.

The isolation area 13 includes an organic layer 9 disposed on the inorganic packaging layer 7.

In some embodiments, the hole area 2 further includes the organic layer 9 disposed on the inorganic packaging layer 7.

According to the display panel provided by the embodiment of the present application, the organic layer is formed on the inorganic packaging layer in the hole area, such that when the display panel is bent, the organic layer disposed on the inorganic packaging layer can release a stress between the inorganic packaging layers, thus avoiding crack of the inorganic packaging layer, ensuring the packaging effect and improving the product yield.

In some embodiments, according to the display panel provided by the embodiment of the present application, the hole area may correspond to an area needing to be provided with a hardware structure. The hardware structure, for example, may include a camera, a telephone receiver, a loudspeaker and the like. The hole area, for example, may be a round area shown in FIG. 1. Of course, the shape of the hole area may be specifically designed according to the actual requirements.

FIG. 2 is a cross-sectional view along the direction AA' in FIG. 1. During specific implementation, as shown in FIG. 2, the packaging structure 6, for example, may be formed by alternately stacking two inorganic packaging layers 7 and one organic packaging layer 8, and the organic packaging layer 8 is located between the two inorganic packaging layers 7.

In some embodiments, as shown in FIG. 2, the display panel further includes a first blocking wall 10 located between the display area and the hole area for blocking extension of the organic packaging layer, a second blocking wall 11 located between the first blocking wall 10 and the hole area 2, and isolation columns 12 located between the second blocking wall 11 and the hole area 2; and the organic layer 9 extends from the hole area 2 to cover the isolation columns 12, the second blocking wall 11 and at least part of the first blocking wall 10.

In FIG. 2, the first blocking wall 10, the second blocking wall 11 and the isolation columns 12 are located in the isolation area 13 between the hole area 2 and the display area 1, where the first blocking wall blocks extension of the organic packaging layer. That is, in the area outside the side, facing away from the organic packaging layer, of the first blocking wall 10, the packaging structure only includes the inorganic packaging layers.

In some embodiments, as shown in FIG. 2, the organic layer 9 covers the edge of the organic packaging layer 8.

According to the display panel provided by the embodiment of the present application, the organic layer covers the hole area, extends to cover the isolation columns, the second blocking wall and the first blocking wall, and covers the edge of the organic packaging layer, such that the organic layer can completely cover an area only provided with the inorganic packaging layers, thus avoiding crack of the inorganic packaging layers caused by the fact that the stress between the inorganic packaging layers cannot be released during bending of the display panel, ensuring the packaging effect and improving the product yield.

In some embodiments, as shown in FIG. 2, the distance from the surface, facing away from the base substrate 4, of the organic layer 9 to the base substrate 4 is approximately equal to the distance from the surface, facing away from the base substrate 4, of the packaging structure 6 of the display area 1 to the base substrate 4.

According to the display panel provided by the embodiment of the present application, the distance from the surface of the side, facing away from the base substrate, of the organic layer to the base substrate is approximately equal to the distance from the surface of the side, facing away from the base substrate, of the packaging structure in the display area to the base substrate. While releasing a bending stress of the inorganic packaging layer using the organic layer, it may also planarize the hole area using the organic layer. When a process of arranging a touch module on the display panel provided by the embodiment of the present application is required, a mask can be saved because a process of arranging a planarization layer at an area surrounded by the display area is no longer required.

Figure 3:
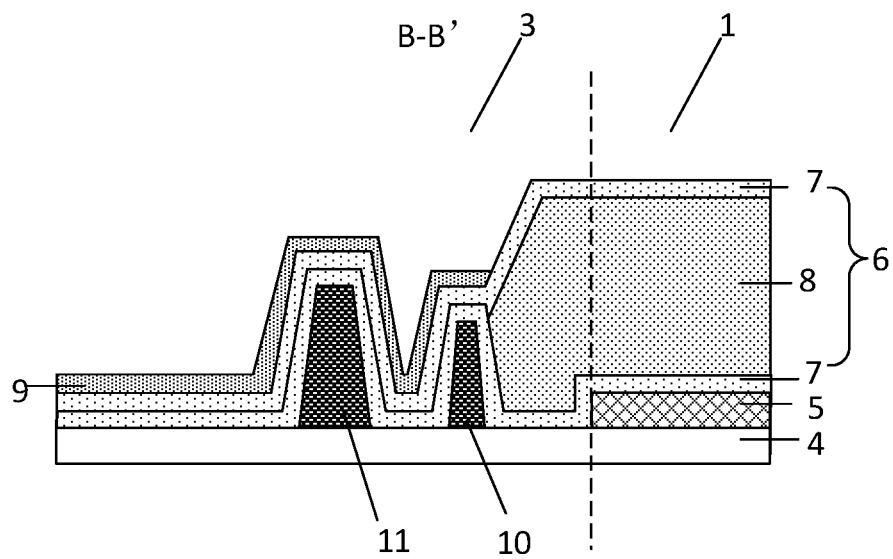
FIG. 3 is yet another schematic diagram of a display panel provided by an embodiment of the present application.

In some embodiments, as shown in FIG. 1 and FIG. 3, FIG. 3 is a cross-sectional view along the direction BB' in FIG. 1, the inorganic packaging layers 7 extend to the peripheral area 3, and the peripheral area 3 further includes the organic layer 9 located on the packaging structure 6.

According to the display panel provided by the embodiment of the present application, the peripheral area further includes the organic layer covering the inorganic packaging layers, which can avoid crack of the inorganic packaging layers caused by the fact that the stress of the inorganic packaging layers in the peripheral area cannot be released, thus avoiding curling and peeling of the inorganic packaging layers, preventing packaging failure and improving the product yield.

In some embodiments, as shown in FIG. 3, the peripheral area includes a first blocking wall 10 close to the display area, and a second blocking wall 11 located on one side, facing away from the display area, of the first blocking wall. The first blocking wall blocks extension of the organic packaging layer. The organic layer 9 covers the edge of the organic packaging layer 8 and covers an area at the side, facing away from the display area, of the edge of the organic packaging layer 8. The organic layer 9 in the peripheral area covers the second blocking wall 11 and at least part of the first blocking wall 10.

In some embodiments, a thickness of the organic layer in the peripheral area ranges from 5 microns to 10 microns.

In some embodiments, a material of the organic layer and a material of the organic packaging layer include acrylic resin.

According to the display panel provided by the embodiment of the present application, the materials of the organic layer and the organic packaging layer are the same and cannot affect the performance of the display panel. Moreover, using the acrylic resin as the organic material can prevent the organic layer from absorbing water, thus preventing the packaging structure from being eroded by water, improving the sealing effect and ensuring the product yield.

In some embodiments, a material of the inorganic packaging layer includes one or a combination of silicon nitride ($SiN_x$) and silicon oxynitride (SiON).

In some embodiments, according to the display panel provided by the embodiment of the present application, the base substrate, for example, may be a flexible base substrate.

In some embodiments, according to the display panel provided by the embodiment of the present application, the electroluminescent device may be an organic light-emitting diode (OLED), and may also be a quantum dot light-emitting diode (QLED) device. The electroluminescent device may include an anode, a light-emitting layer and a cathode which are stacked. Further, the light-emitting layer may further include a hole injection layer, a hole transport layer, an electron transport layer, an electron injection layer and other film layers. The electroluminescent devices are in one-to-one correspondence to sub-pixels of the display panel. The sub-pixels of the display panel, for example, may include: a red sub-pixel, a blue sub-pixel and a green sub-pixel. Accordingly, the electroluminescent devices may include: a red light electroluminescent device, a blue light electroluminescent device and a green light electroluminescent device.

In some embodiments, a pixel circuit (not shown) with thin film transistors electrically connected to the electroluminescent device may be provided between the base substrate and the electroluminescent device. The thin film transistor, for example, may be a top-gate structured thin film transistor, including: an active layer, a gate insulating layer disposed on the active layer, a gate layer disposed on the gate insulating layer, an interlayer insulating layer disposed on the gate layer, and a source-drain electrode layer disposed on the interlayer insulating layer. The source-drain electrode layer is electrically connected to the active layer through a via hole penetrating through the interlayer insulating layer. A planarization layer is disposed on the source-drain electrode layer, the electroluminescent device is arranged on the planarization layer, and the anode of the electroluminescent device is electrically connected to the source-drain electrode layer through a via hole penetrating through the planarization layer. A pixel defining layer for dividing sub-pixels is disposed on the planarization layer. In some embodiments, the first blocking wall and the second blocking wall may each include: a first part and a second part. The first part and the planarization layer are arranged on the same layer, and the second part and the pixel defining layer are arranged on the same layer. The isolation columns may, for example, be arranged on the same layer as the pixel defining layer. Of course, the isolation columns, the first blocking wall and the second blocking wall may be formed independently as long as the isolation columns, the first blocking wall and the second blocking wall can play corresponding roles.

Figure 4:
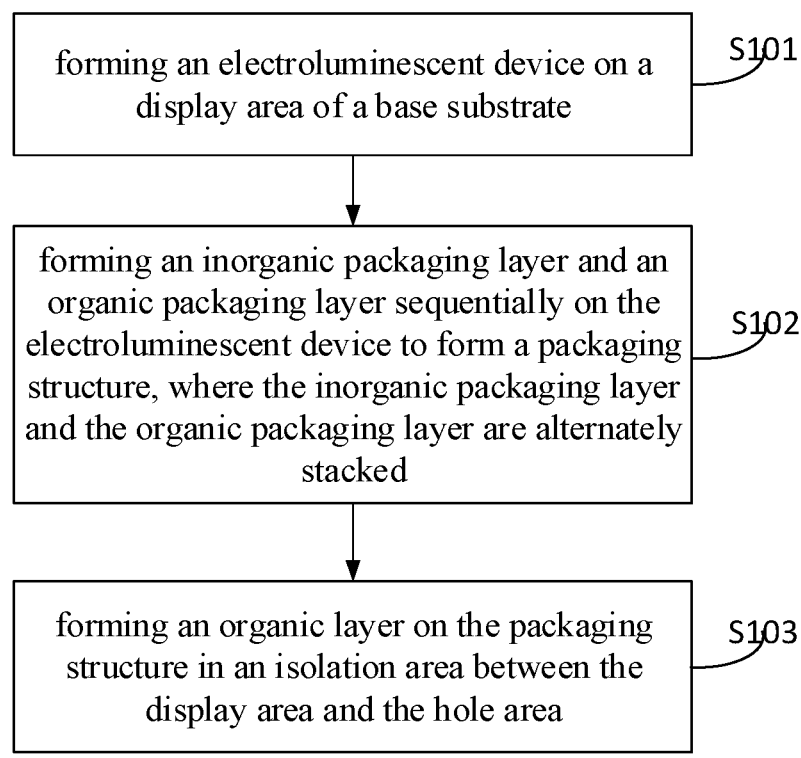
FIG. 4 is a flowchart of a preparation method of a display panel provided by an embodiment of the present application.

Based on the same inventive concept, an embodiment of the present application further provides a preparation method of a display panel. As shown in FIG. 4, the method includes:

S101: forming an electroluminescent device on a display area of a base substrate;

S102: forming an inorganic packaging layer and an organic packaging layer sequentially on the electroluminescent device to form a packaging structure, where the inorganic packaging layer and the organic packaging layer are alternately stacked, and the inorganic packaging layer extends from the display area to a hole area located at the display area; and S103: forming an organic layer on the packaging structure in an isolation area between the display area and the hole area.

In some embodiments, while forming an organic layer on the packaging structure in the isolation area between the display area and the hole area, the preparation method of the display panel provided by the embodiment of the present application further includes: forming the organic layer on the packaging structure in the hole area.

According to the preparation method of the display panel provided by the embodiment of the present application, the organic layer is formed on the inorganic packaging layer in the hole area, such that when the display panel is bent, the organic layer located on the inorganic packaging layers can release a stress between the inorganic packaging layers, thus avoiding crack of the inorganic packaging layers, ensuring the packaging effect and improving the product yield.

In some embodiments, the inorganic packaging layer extends to the peripheral area surrounding the display area, while forming the organic layer on the packaging structure in the hole area, the method further includes: forming the organic layer on the packaging structure in the peripheral area.

In some embodiments, the step of forming the organic layer on the packaging structure specifically includes: forming the organic layer on the inorganic packaging layer using an ink-jet printing process.

In some embodiments, when the base substrate is a flexible base substrate, before forming the electroluminescent device on the display area of the base substrate, the method further includes a step of forming a flexible base substrate on a glass substrate.

In some embodiments, before forming the electroluminescent device on the display area of the base substrate, the method further includes:

forming film layers of a pixel circuit with thin film transistors on the flexible base substrate; and forming a planarization layer with a via hole on the film layers of the pixel circuit with thin film transistors.

In some embodiments, while forming the planarization layer, the method further includes: forming a pattern of a first part of a first blocking wall and a pattern of a first part of a second blocking wall at the isolation area and the peripheral area.

In some embodiments, the step of forming an electroluminescent device specifically includes: forming an anode, a light-emitting layer and a cathode on the planarization layer sequentially.

In some embodiments, the anode is electrically connected to the thin film transistor through the via hole of the planarization layer. Before forming the light-emitting layer, the method further includes: forming a pattern of a pixel defining layer spaced from the anode, and forming a pattern of an isolation column at the isolation area.

In some embodiments, the step of forming an inorganic packaging layer specifically includes: forming the inorganic packaging layer using a chemical vapor deposition (CVD) process.

In some embodiments, the step of forming an organic packaging layer specifically includes: forming the organic packaging layer using an ink-jet printing process.

Then, taking the case where the packaging structure includes two inorganic packaging layers and one organic packaging layer as an example, the preparation method of the display panel provided by the embodiment of the present application is illustrated. The preparation method of the display panel specifically includes the following steps:

S201: forming a flexible base substrate on a glass substrate;

S202: forming film layers of a pixel circuit with thin film transistors on the flexible base substrate;

S203: depositing a material of a planarization layer, forming a pattern of the planarization layer using a patterning process on the film layers of the pixel circuit with thin film transistors, and forming a pattern of a first part of a first blocking wall and a pattern of a first part of a second blocking wall at an isolation area and a peripheral area on the glass substrate;

S204: forming a pattern of an anode on the planarization layer;

S205: depositing a material of a pixel defining layer, forming a pattern of the pixel defining layer using a patterning process on the planarization layer, forming a pattern of a second part of the first blocking wall and a pattern of a second part of the second blocking wall at the isolation area and the peripheral area, and forming a pattern of an isolation column at the isolation area;

S206: forming a light-emitting layer on the anode using an evaporation process;

S207: forming a cathode on the light-emitting layer;

S208: depositing an inorganic material using a CVD process to form an inorganic packaging layer on the cathode, forming an organic packaging layer on the inorganic packaging layer using an ink-jet printing process, and then depositing the inorganic material on the organic packaging layer using the CVD process to form the inorganic packaging layer; and S209: forming an organic layer on the inorganic packaging layer in the isolation area, the hole area and the peripheral area using the ink-jet printing process.

An embodiment of the present application provides a display device. The display device includes the above display panel provided by the embodiment of the present application.

The display device provided by the embodiment of the present application, for example, may be a mobile phone, a tablet computer, a television, etc.

In conclusion, according to the display panel and the preparation method thereof, and the display device, which are provided by the embodiment of the present application, the organic layer is formed on the inorganic packaging layer in the hole area, such that when the display panel is bent, the organic layer located on the inorganic packaging layers can release a stress between the inorganic packaging layers, thus avoiding crack of the inorganic packaging layers, ensuring the packaging effect and improving the product yield.

Obviously, those skilled in the art can make various modifications and variations to the present application without departing from the spirit and scope of the present application. Therefore, the present application is intended to cover these modifications and variations provided that they fall within the scope of the claims of the present application and their equivalent technologies.

What is claimed is:

1. A display panel, comprising a base substrate, and having:
   a display area,
   a peripheral area surrounding the display area,
   a hole area located at the display area, and
   an isolation area located between the hole area and the display area,
   wherein the display area and the isolation area surround the hole area;
   the display area comprises:
      an electroluminescent device located on the base substrate, and
      a packaging structure for sealing the electroluminescent device, wherein the packaging structure comprises a first inorganic packaging layer, an organic packaging layer, and a second inorganic packaging layer stacked in sequence on the electroluminescent device, the first inorganic packaging layer and the second inorganic packaging layer extend to the isolation area and the hole area, the first inorganic packaging layer is in direct contact with the base substrate in the hole area, orthographic projections of the first inorganic packaging layer and the second inorganic packaging layer on the base substrate cover an orthographic projection of the hole area on the base substrate, and an orthographic projection of the organic packaging layer on the base substrate does not overlap the orthographic projection of the hole area on the base substrate; and
   wherein the isolation area comprises an organic layer disposed at a side, facing away from the base substrate, of the second inorganic packaging layer, and the organic layer is disposed at a side, close to the hole area, of the organic packaging layer.

2. The display panel of claim 1, wherein the hole area further comprises:
   the organic layer disposed on the second inorganic packaging layer;
   wherein an orthographic projection of the organic layer on the base substrate covers the orthographic projection of the hole area on the base substrate.

3. The display panel of claim 2, wherein the isolation area further comprises:
   a first blocking wall for blocking extension of the organic packaging layer,
   a second blocking wall located between the first blocking wall and the hole area, and
   an isolation column located between the second blocking wall and the hole area; and
   wherein the organic layer extends from the hole area to cover the isolation column, the second blocking wall and at least part of the first blocking wall.

4. The display panel of claim 3, wherein the organic layer covers an edge of the organic packaging layer.

5. The display panel of claim 1, wherein a distance from a surface, facing away from the base substrate, of the organic layer to the base substrate is approximately equal to a distance from a surface, facing away from the base substrate, of the packaging structure in the display area to the base substrate.

6. The display panel of claim 1, wherein a material of the organic layer is equal to a material of the organic packaging layer.

7. The display panel of claim 6, wherein the material of the organic layer and the material of the organic packaging layer comprise acrylic resin.

8. The display panel of claim 1, wherein the first inorganic packaging layer and the second inorganic packaging layer extend to the peripheral area, and the peripheral area further comprises the organic layer disposed on the second inorganic packaging layer.

9. The display panel of claim 8, wherein a thickness of the organic layer of the peripheral area ranges from 5 microns to 10 microns.

10. A preparation method of a display panel, comprising:
   forming an electroluminescent device on a display area of a base substrate;
   forming a first inorganic packaging layer, an organic packaging layer, and a second inorganic packaging layer sequentially on the electroluminescent device to form a packaging structure;

wherein the first inorganic packaging layer and the second inorganic packaging layer extend from the display area to an isolation area and a hole area located at the display area, the first inorganic packaging layer is in direct contact with the base substrate in the hole area, orthographic projections of the first inorganic packaging layer and the second inorganic packaging layer on the base substrate cover an orthographic projection of the hole area on the base substrate, and an orthographic projection of the organic packaging layer on the base substrate does not overlap the orthographic projection of the hole area on the base substrate; and forming an organic layer at a side, facing away from the base substrate, of the second inorganic packaging layer in the isolation area between the display area and the hole area, wherein the organic layer is disposed at a side, close to the hole area, of the organic packaging layer; and the display area and the isolation area surround the hole area.

11. The method of claim 10, wherein, while forming the organic layer on the second inorganic packaging layer in the isolation area, the method further comprises:

forming the organic layer on the second inorganic packaging layer in the hole area;

wherein an orthographic projection of the organic layer on the base substrate covers the orthographic projection of the hole area on the base substrate.

12. The method of claim 11, wherein the first inorganic packaging layer and the second inorganic packaging layer extend to a peripheral area surrounding the display area, while forming the organic layer on the second inorganic packaging layer in the hole area, the method further comprises:

forming the organic layer on the second inorganic packaging layer in the peripheral area.

13. A display device, comprising a display panel, wherein the display panel comprises a base substrate, and has:

a display area, a peripheral area surrounding the display area, a hole area located at the display area, and an isolation area located between the hole area and the display area, and wherein the display area and the isolation area surround the hole area;

the display area comprises:

an electroluminescent device located on the base substrate, and a packaging structure for sealing the electroluminescent device, wherein the packaging structure comprises a first inorganic packaging layer, an organic packaging layer, and a second inorganic packaging layer stacked in sequence on the electroluminescent device, the first inorganic packaging layer and the second inorganic packaging layer extend to the isolation area and the hole area, the first inorganic packaging layer is in direct contact with the base substrate in the hole area, orthographic projections of the first inorganic packaging layer and the second inorganic packaging layer on the base substrate cover an orthographic projection of the hole area on the base substrate, and an orthographic projection of the organic packaging layer on the base substrate does not overlap the orthographic projection of the hole area on the base substrate; and wherein the isolation area comprises an organic layer disposed at a side, facing away from the base substrate, of the second inorganic packaging layer, and the organic layer is disposed at a side, close to the hole area, of the organic packaging layer.

14. The display device of claim 13, wherein the hole area further comprises:

the organic layer disposed on the second inorganic packaging layer;

wherein an orthographic projection of the organic layer on the base substrate covers the orthographic projection of the hole area on the base substrate.

15. The display device of claim 14, wherein the isolation area further comprises:

a first blocking wall for blocking extension of the organic packaging layer, a second blocking wall located between the first blocking wall and the hole area, and an isolation column located between the second blocking wall and the hole area; and wherein the organic layer extends from the hole area to cover the isolation column, the second blocking wall and at least part of the first blocking wall.

16. The display device of claim 15, wherein the organic layer covers an edge of the organic packaging layer.

17. The display device of claim 13, wherein a distance from a surface, facing away from the base substrate, of the organic layer to the base substrate is approximately equal to a distance from a surface, facing away from the base substrate, of the packaging structure in the display area to the base substrate.

18. The display device of claim 17, wherein a material of the organic layer is equal to a material of the organic packaging layer; and the material of the organic layer and the material of the organic packaging layer comprise acrylic resin.

19. The device of claim 13, wherein the first inorganic packaging layer and the second inorganic packaging layer extend to the peripheral area, and the peripheral area further comprises the organic layer disposed on the second inorganic packaging layer.

20. The device of claim 19, wherein a thickness of the organic layer of the peripheral area ranges from 5 microns to 10 microns.

* * * * *